(12) United States Patent
Yoon et al.

(10) Patent No.: US 6,529,423 B1
(45) Date of Patent: Mar. 4, 2003

(54) INTERNAL CLOCK SIGNAL DELAY CIRCUIT AND METHOD FOR DELAYING INTERNAL CLOCK SIGNAL IN SEMICONDUCTOR DEVICE

(75) Inventors: Sei-seung Yoon; Sang-pyo Hong, both of Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/511,642

(22) Filed: Feb. 22, 2000

(30) Foreign Application Priority Data

Feb. 23, 1999 (KR) ............................................. 99-5904

(51) Int. Cl.[7] ................................................. G11C 7/00
(52) U.S. Cl. ................... 365/194; 365/233; 365/230.06
(58) Field of Search ............................. 365/194, 230.06, 365/191, 189.08, 233

(56) References Cited

U.S. PATENT DOCUMENTS

| | | | | |
|---|---|---|---|---|
| 5,444,398 A | | 8/1995 | Kiehl et al. ..................... | 327/55 |
| 5,444,667 A | * | 8/1995 | Obara ......................... | 365/233 |
| 5,566,108 A | * | 10/1996 | Kitamura ..................... | 365/233 |
| 5,729,500 A | * | 3/1998 | Shinozaki .............. | 365/230.01 |
| 6,151,270 A | * | 11/2000 | Jeong .......................... | 365/233 |

* cited by examiner

Primary Examiner—David Nelms
Assistant Examiner—Thong Le
(74) Attorney, Agent, or Firm—Skjerven Morrill MacPherson LLP; David W. Heid

(57) ABSTRACT

An internal clock delay circuit of a semiconductor device and a method for delaying an internal clock of the semiconductor device. The semiconductor device includes a CAS latency signal generator that generates CAS latency signals comprising a first CAS latency signal, a second CAS latency signal and a third CAS latency signal, and an internal clock delay circuit that receives one of the CAS latency signals and an internal clock signal and delays the internal clock signal by a predetermined time in response to the received CAS latency signal. The internal clock delay circuit includes delay circuits that delay the internal clock signal, and the internal clock signal passes through only one among the delay circuits when the semiconductor device operates in the second CAS latency mode. The method includes: inputting an internal clock signal to an internal clock delay circuit, which includes delayers, of a semiconductor device; and inputting CAS latency signals to the internal clock delay circuit to determine CAS latency modes of the semiconductor device; and outputting the internal clock signal through the delay circuits as an output signal of the internal clock signal delay circuit. The internal clock signal passes through one of the delay circuits in a second CAS latency mode and passes through at least two delay circuits among the delay circuits in either a first CAS latency mode or a third CAS latency mode.

19 Claims, 4 Drawing Sheets

INTERNAL CLOCK SIGNAL DELAY CIRCUIT AND METHOD FOR DELAYING INTERNAL CLOCK SIGNAL IN SEMICONDUCTOR DEVICE

BACKGROUND OF THE INVENTION

1. Field of the Invention

The present invention relates to semiconductor devices and more particularly, to an internal clock signal delay circuit for a synchronous DRAM.

2. Description of the Related Art

A synchronous DRAM operates in synchronization with an internal clock signal generated in response to an external clock signal from a CPU. In reading a first data from a row of memory cells of a synchronous DRAM, a row address strobe (RAS) signal enables a reading wordline, and then column select line (CSL) is enabled. Generally, the first data from a row requires more time between enabling the wordlines and selecting the column lines for data output. However, when the clock frequency of the CPU is high, that is, when the period of a clock signal is short, the synchronous DRAM may need to delay the CSL enabling signal by more than one clock period, so that the first data is valid when read.

SUMMARY OF THE INVENTION

The present invention is directed to a synchronous DRAM in which internal clock signal is delayed in three CAS latency modes to control the timing of CSL enabling.

In accordance with an embodiment of the present invention, a semiconductor device includes a CAS latency signal generator that generates CAS latency signals comprising a first CAS latency signal, a second CAS latency signal and a third CAS latency signal, and an internal clock delay circuit that receives one of the CAS latency signals and an internal clock signal and delays the internal clock signal by a predetermined time in response to the received CAS latency signal. The internal clock delay circuit includes delay circuits that delays the internal clock signal, and the internal clock signal passes through only one among the delayers when the semiconductor device operates in the second CAS latency mode.

Another embodiment of the invention provides a semiconductor device, which includes: a CAS latency signal generator that generates CAS latency signals; and an internal clock delay circuit that receives an internal clock signal and second and third CAS latency signals and generates a delayed internal clock signal. The second and third CAS latency signals are disabled when the semiconductor device operates in a first CAS latency mode, the second CAS latency signal is enabled when the semiconductor device operates in a second CAS latency mode, and the third CAS latency signal is enabled when the semiconductor device operates in a third CAS latency mode. The internal clock delay circuit includes: a first delay circuit that receives the internal clock signal; a second delay circuit connected to the first delay circuit; a third delay circuit connected to the second delay circuit; a first controller that receives an output signal of the first delay circuit and the second CAS latency signal; a second controller that receives an output signal of the second delay circuit and the second and third CAS latency signals; and a third controller that receives an output signal of the third delay circuit and the second and third CAS latency signals. The internal clock delay circuit can further include a fourth controller that receives outputs of the first, second and third controllers.

Still another embodiment of the invention provides a semiconductor device, which includes: a CAS latency signal generator that generates CAS latency signals; and an internal clock delay circuit that receives an internal clock signal and first and third CAS latency signals and generates a delayed internal clock signal. The first CAS latency signal is enabled when the semiconductor device operates in a first CAS latency mode, the first and third CAS latency signals are disabled when the semiconductor device operates in a second CAS latency mode, and the third CAS latency signal is enabled when the semiconductor device operates in a third CAS latency mode. The internal clock delay circuit includes: a first delay circuit that receives the internal clock signal; a second delay circuit connected to the first delay circuit; a third delay circuit connected to the first delay circuit in parallel with the second delay circuit; a first controller that receives an output signal of the first delay circuit and the first and third CAS latency signals; a second controller that receives an output signal of the second delay circuit and the first CAS latency signal; and a third controller that receives an output signal of the third delay circuit and the third CAS latency signal. The internal clock delay circuit can further include a fourth controller that receives the outputs of the first, second and third controllers.

The present invention is also directed to a method for delaying the internal clock signal of a synchronous DRAM, which decreases the generation time of the delayed internal clock signal in the second CAS latency mode. The method includes: inputting an internal clock signal to an internal clock delay circuit, which includes delay circuits, of a semiconductor device; and inputting CAS latency signals to the internal clock delay circuit to determine CAS latency modes of the semiconductor device; and outputting the internal clock signal through the delayers as an output signal of the internal clock signal delay circuit. The internal clock signal passes through one of the delay circuits in a second CAS latency mode and passes through at least two delay circuits among the delay circuits in either a first CAS latency mode or a third CAS latency mode.

BRIEF DESCRIPTION OF THE DRAWINGS

The features and advantages of the present invention will become more apparent by describing in detail specific embodiments thereof with reference to the attached drawings in which.

Use of the same reference symbols in different figures indicates similar or identical items.

DESCRIPTION OF THE PREFERRED EMBODIMENTS

In accordance with an aspect of the present invention, an internal clock signal delay circuit delays an internal clock signal in three column address strobe (CAS) latency modes to control the timing of CSL enabling: a first CAS latency mode, a second CAS latency mode, and a third CAS latency mode. The first CAS latency mode delays the internal clock signal such that the synchronous DRAM outputs data one clock cycle of CPU clock after a row line is activated. This mode is often used in testing the reliability of the cells of the synchronous DRAM. The second CAS latency mode delays the internal clock signal such that the synchronous DRAM outputs data after the second cycle of CPU clock. The third CAS latency mode delays the internal clock signal such that the synchronous DRAM outputs data after the third cycle of CPU clock. The second and third modes are used in normal read/write operation of the synchronous DRAM depending on the CPU clock frequency.

Figure 1:
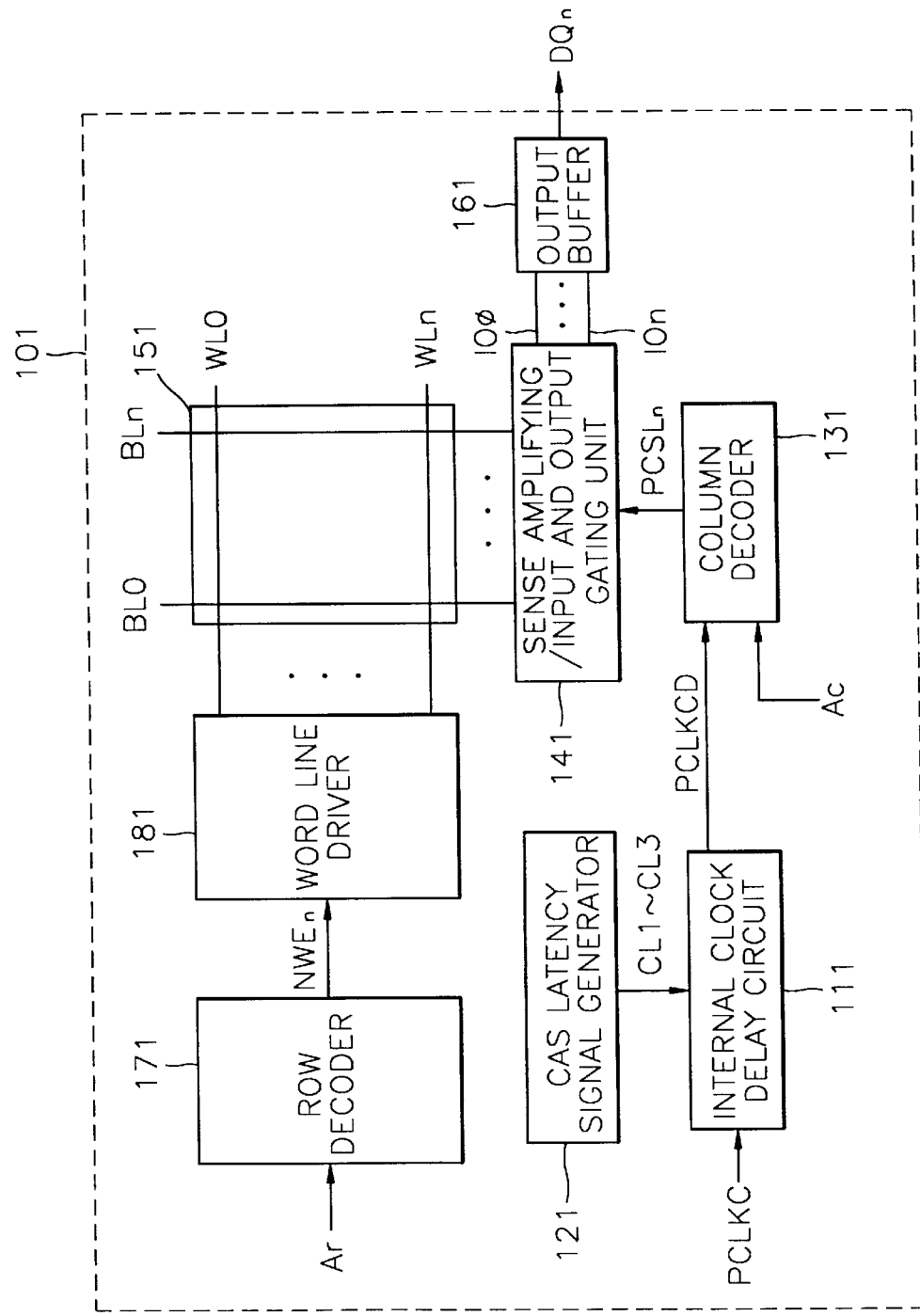
FIG. 1 is a block diagram of a synchronous DRAM according to an embodiment of the present invention.

FIG. 1 illustrates a synchronous DRAM 101 according to an embodiment of the present invention. The synchronous DRAM 101 includes an internal clock delay circuit 111, a column address strobe (CAS) latency signal generator 121, a column decoder 131, a sense amplifying and input and output gating unit 141, an output buffer 161, a row decoder 171, a wordline driver 181, and a memory array 151.

The CAS latency signal generator 121 generates first, second, and third CAS latency signals CL1, CL2, and/or CL3, which control the CAS latency mode of the synchronous DRAM 101. In the first CAS latency mode, the synchronous DRAM 101 reads and outputs data DQn from the memory array 151 after the first rising edge of an internal clock signal PCLKC generated in response to an external read command. In the second CAS latency mode, the synchronous DRAM 101 reads and outputs the data DQn after the second rising edge of the internal clock signal PCLKC. In the third CAS latency mode, the synchronous DRAM 101 reads and outputs the data DQn after the third rising edge of the internal clock signal PCLKC.

The internal clock delay circuit 111 receives the internal clock signal PCLKC and the first, second, and third CAS latency signals CL1, CL2, and CL3 and generates a delayed internal clock signal PCLKCD. The delayed internal clock signal PCLKCD is a delayed version of the internal clock signal PCLKC, and the first, second, and third CAS latency signals CL1, CL2, and CL3 control and vary the amount of delay. The column decoder 131 receives a column address signal Ac from outside synchronous DRAM 101 and the delayed internal clock signal PCLKCD and generates column selection line enable signals PCSLn by decoding the column address signal Ac in synchronization with the delayed internal clock signal PCLKCD.

The row decoder 171 decodes a row address signal Ar received from outside synchronous DRAM 101 and generates wordline enable signals NWEn for selecting among wordlines WL0 to WLn and activating the selected wordlines. The wordline driver 181 receives the wordline enable signals NWEn and applies a boosting voltage on the selected wordlines higher than the internal power supply voltage. The memory array 151 includes memory cells (not shown). Data is read from or written to memory cells connected to the selected wordlines. The data read from the memory cells is transmitted to the sense amplifying and input and output gating unit 141 through bitlines BL0 to BLn. In the sense amplifying and input and output gating unit 141, the column selection line enable signals PCSLn select among the data transmitted to the sense amplifying and input and output gating unit 141 so that the selected data are transmitted to the output buffer 161 through input and output lines IO0 to IOn. The output buffer 161 outputs the transmitted data from the synchronous DRAM 101.

Figure 2:
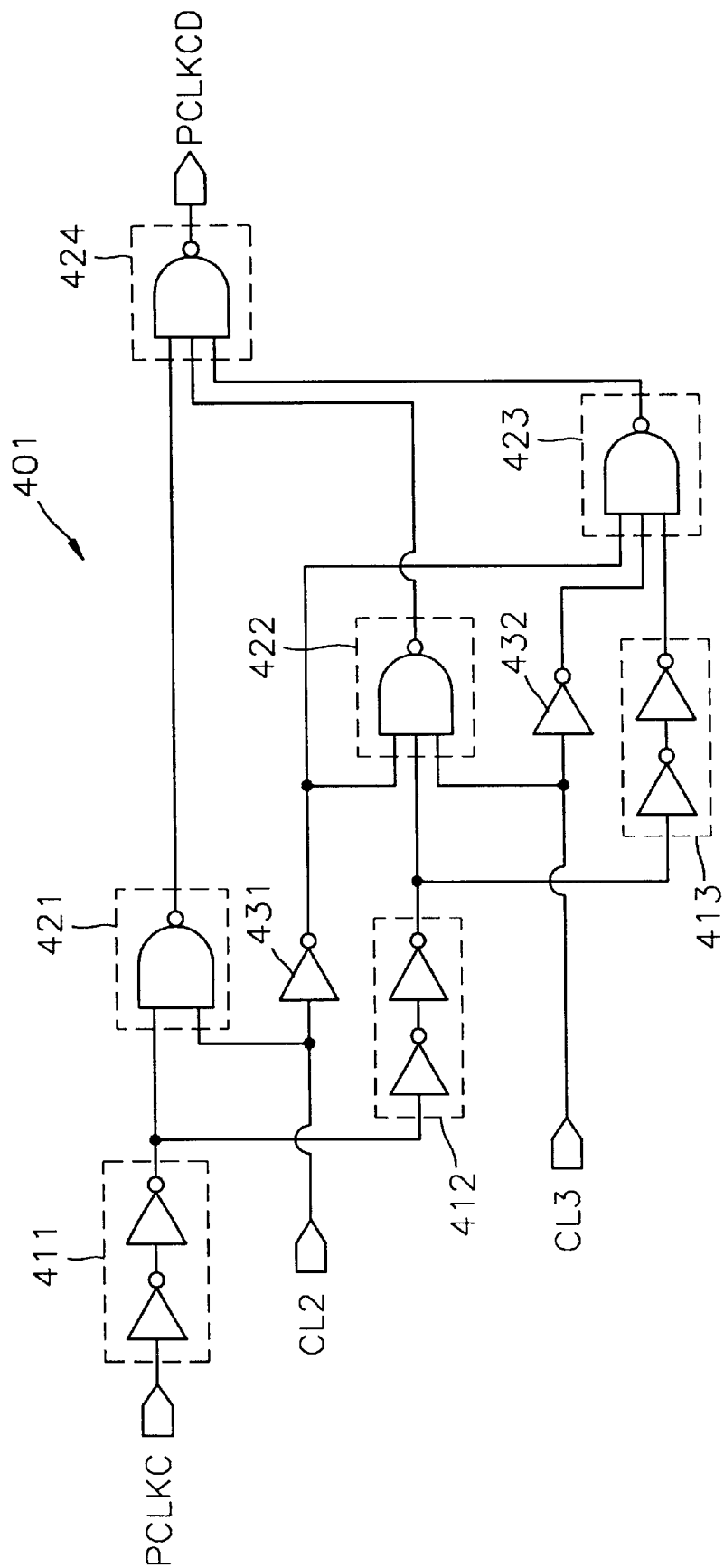
FIG. 2 is a circuit diagram of an embodiment of an internal clock signal delay circuit of FIG. 1.

FIG. 2 illustrates an internal clock signal delay circuit 401, which is an embodiment of the internal clock signal delay circuit 111 of FIG. 1. The internal clock signal delay circuit 401 includes three delay circuits 411, 412 and 413 and four controllers 421 to 424. The internal clock delay circuit 401 receives internal clock signal PCLKC, second CAS latency signal CL2, and third CAS latency signal CL3 and generates delayed internal clock signal PCLKCD, which is a version of the internal clock signal PCLKC delayed by a predetermined time. The delay time of the delayed internal clock signal PCLKCD varies according to the CAS latency mode of the synchronous DRAM. Each of the delay circuits 411 to 413 includes an even number of invertors. It is possible to control the delay time of the delay circuits 411 to 413 by varying the number of the invertors. Each of the controllers 421 to 424 includes a NAND gate. Alternatively, the controllers 421 to 424 can include transmission gates or field effect transistors.

When the synchronous DRAM operates in the first CAS latency mode, the second CAS latency signal CL2 and the third CAS latency signal CL3 are disabled to logic low. The output signal of the first controller 421 becomes logic high regardless of the output signal of the first delay circuit 411 since the second CAS latency signal CL2 is logic low. The output signal of the second controller 422 becomes logic high regardless of the output signal of the second delay circuit 412 since the third CAS latency signal CL3 is logic low. The output signal of the third controller 423 is determined by the output signal of the third delay circuit 413 since the output signals of the invertors 431 and 432 are logic high. Accordingly, the output signal of the fourth controller 424 is determined by the output signal of the third controller 423 since the output signals of the first controller 421 and the second controller 422 are logic high.

In the first CAS latency mode, the internal clock signal PCLKC passes through the delayers 411, 412, and 413 and the controllers 423 and 424. Therefore, the delayed internal clock signal PCLKCD is delayed relative to the internal clock signal PCLKC by the total delay time through the delay circuits 411 to 413.

When the synchronous DRAM operates in the third CAS latency mode, the third CAS latency signal CL3 is enabled to logic high, and the second CAS latency signal CL2 is disabled to logic low. The output signal of the first controller 421 becomes logic high regardless of the output signal of the first delay circuit 411 since the second CAS latency signal CL2 is logic low. The output signal of the second controller 422 is determined by the output signal of the second delay circuit 412 since the output signal of the inverter 431 and the third CAS latency signal CL3 are logic high. The output signal of the third controller 423 becomes logic high regardless of the output signals of the third delay circuit 413 and the inverter 431 since the output signal of the inverter 432 is logic low. The output signal of the fourth controller 424 is determined by the output signal of the second controller 422 since the output signals of the first controller 421 and the third controller 423 are logic high.

In the third CAS latency mode, the internal clock signal PCLKC passes through the first and second delay circuits 411 and 412 and the second and fourth controllers 422 and 424. Therefore, the delayed internal clock signal PCLKCD is delayed relative to the internal clock signal PCLKC by the total delay time through the first and second delay circuits 411 and 412. The generation time of the delayed internal clock signal PCLKCD is shorter in the third CAS latency mode than in the first CAS latency mode because the internal clock signal PCLKC does not pass through the third delay circuit 413.

When the synchronous DRAM operates in the second CAS latency mode, the second CAS latency signal CL2 is enabled to logic high, and the third CAS latency signal CL3 is disabled to logic low. Then, the output signal of the first controller 421 is determined by the output signal of the first delay circuit 411 since the second CAS latency signal CL2 is logic high. The output signal of the second controller 422 becomes logic high regardless of the output signal of the second delay circuit 412 since the output signals of the third CAS latency signal CL3 and the inverter 431 are logic low. The output signal of the third controller 423 becomes logic high regardless of the output signals of the third delay circuit 413 and the inverter 432 since the output signal of the inverter 431 is logic low. Accordingly, the output signal of the fourth controller 424 is determined by the output signal of the first controller 421 since the output signals of the second controller 422 and the third controller 423 are logic high.

In the second CAS latency mode, the internal clock signal PCLKC passes through the first delay circuit 411 and the first and fourth controllers 421 and 424. Therefore, the delayed internal clock signal PCLKCD is delayed relative to the internal clock signal PCLKC by the delay time through the first delayer 411. The generation time of the delayed internal clock signal PCLKCD is shorter in the second CAS latency mode than in the third CAS latency mode.

Figure 3:
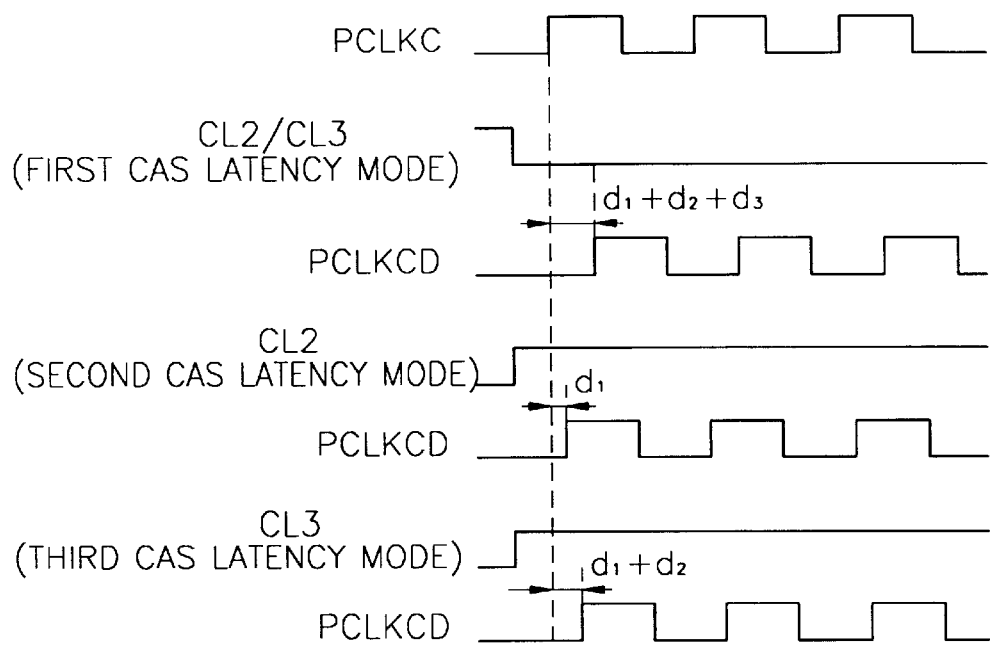
FIG. 3 is a timing diagram for signals in the internal clock signal delay circuit of FIG. 2.

FIG. 3 illustrates the total delay time of the delayed internal clock signal PCLKCD in the first, second and third CAS latency modes of the internal clock delay circuit 401 of FIG. 2. Symbols d1, d2, and d3 denote the delays through the delay circuits 411, 412 and 413, respectively. In the first CAS latency mode, the total delay time is the sum of d1, d2, and d3. In the second CAS latency mode, the total delay time is d1. In the third CAS latency mode, the total delay time is the sum of d1 and d2. Therefore, the total delay time of the delayed internal clock signal PCLKCD is shortest in the second CAS latency mode and longest in the first CAS latency mode.

Figure 4:
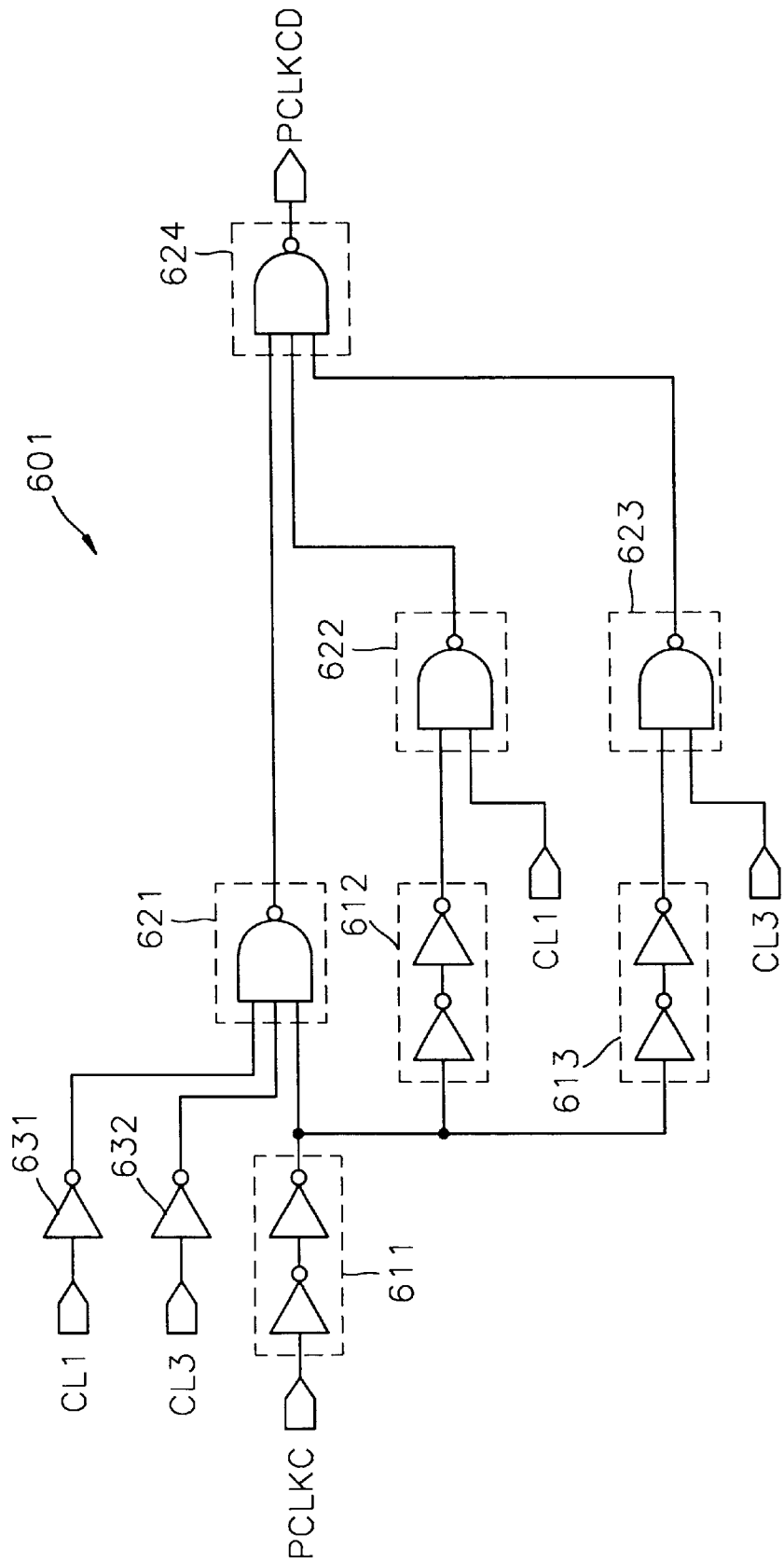
FIG. 4 is a circuit diagram of another embodiment of the internal clock signal delay circuit of FIG. 1.

FIG. 4 illustrates an internal clock delay circuit 601, which is another embodiment of the internal clock delay circuit 111. The internal clock delay circuit 601 includes three delay circuits 611 to 613, four controllers 621 to 624, and invertors 631 and 632. The internal clock delay circuit 601 receives the internal clock signal PCLKC, the first CAS latency signal CL1, and the third CAS latency signal CL3 and outputs the delayed internal clock signal PCLKCD. The delayed internal clock signal PCLKCD is a version of the internal clock signal PCLKC delayed by a predetermined time. The delay time of the delayed internal clock signal PCLKCD varies according to the CAS latency mode of the internal clock delay circuit 601. Each of the delay circuits 611 to 613 includes an even number of invertors. It is possible to control the delay time of the delay circuits 611 to 613 by varying the number of the invertors. Each of the controllers 621 to 624 includes a NAND gate. Alternatively, the controllers 621 to 624 can include transmission gates or field effect transistors.

In the first CAS latency mode, the first CAS latency signal CL1 is enabled to logic high, and the third CAS latency signal CL3 is disabled to logic low. When the first CAS latency signal CL1 is logic high, the output signal of the inverter 631 becomes logic low. Thus, the output signal of the first controller 621 becomes logic high regardless of the output signals of the first delay circuit 611 and the inverter 632. The output signal of the second controller 622 is determined by the output signal of the second delayer 612 since the first CAS latency signal CL1 is logic high. The output signal of the third controller 623 becomes logic high regardless of the output signal of the third delay circuit 613 since the third CAS latency signal CL3 is logic low. Accordingly, the output signal of the fourth controller 624 is determined by the output signal of the second controller 622 since the output signals of the first controller 621 and the third controller 623 are logic high.

In the first CAS latency mode, the internal clock signal PCLKC passes through the first and second delay circuits 611 and 612 and the second and fourth controllers 622 and 624. Therefore, the delayed internal clock signal PCLKCD is delayed with respect to the internal clock signal PCLKC by the total delay time through the first and second delay circuits 611 and 612.

In the third CAS latency mode, the third CAS latency signal CL3 is enabled to logic high, and the first CAS latency signal CL1 is disabled to logic low. Since the third CAS latency signal CL3 is logic high, the output signal of the inverter 632 becomes logic low. Therefore, the output signal of the first controller 621 becomes logic high regardless of the output signals of the first delay circuit 611 and the inverter 631. The output signal of the second controller 622 becomes logic high regardless of the output signal of the second delay circuit 612 since the first CAS latency signal CL1 is logic low. The output signal of the third controller 623 is determined by the output signal of the third delay circuit 613 since the third CAS latency signal CL3 is logic high. Accordingly, the output signal of the fourth controller 624 is determined by the output signal of the third controller 623 since the output signals of the first controller 621 and the second controller 622 are logic high.

In the third CAS latency mode, the internal clock signal PCLKC passes through the first and third delay circuits 611 and 613 and the third and fourth controllers 623 and 624. Therefore, the delayed internal clock signal PCLKCD is delayed relative to the internal clock signal PCLKC by the total delay time of the first and third delay circuits 611 and 613. In the third CAS latency mode, the number of invertors in the third delay circuit 613 affects the generation time of the delayed internal clock signal PCLKCD.

In the second CAS latency mode, the first CAS latency signal CL1 and the third CAS latency signal CL3 are disabled to logic low. When the first and third CAS latency signals CL1 and CL3 are logic low, the output signals of the invertors 631 and 632 become logic high. Therefore, the output signal of the first controller 621 is determined by the output signal of the first delay circuit 611. The output signal of the second controller 622 becomes logic high regardless of the output signal of the second delay circuit 612 since the first CAS latency signal CL1 is logic low. The output signal of the third controller 623 becomes logic high regardless of the output signal of the third delay circuit 613 since the third CAS latency signal CL3 is logic low. Accordingly, the output signal of the fourth controller 624 is determined by the output signal of the first controller 621 since the output signals of the second controller 622 and the third controller 623 are logic high.

In the second CAS latency mode, the internal clock signal PCLKC passes through the first delay circuit 611 and the first and fourth controllers 621 and 624. Therefore, the delayed internal clock signal PCLKCD is delayed relative to the internal clock signal PCLKC by the delay time of the first delay circuit 611. The delay time of the delayed internal clock signal PCLKCD is shorter in the second CAS latency mode than in the first and third CAS latency modes.

Figure 5:
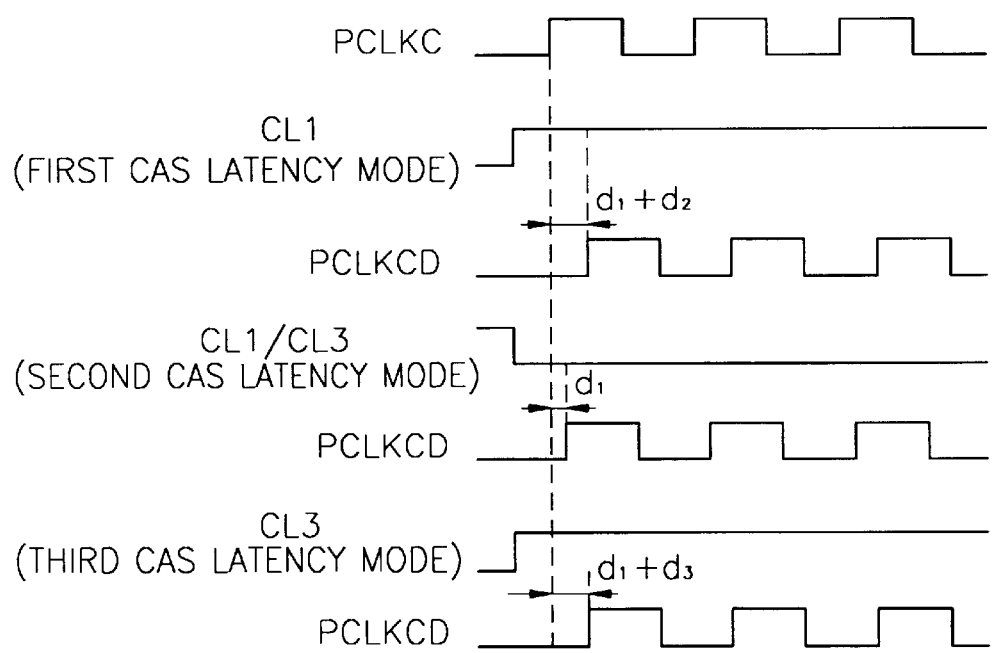
FIG. 5 is a timing diagram for signals in the internal clock signal delay circuit of FIG. 4.

FIG. 5 illustrates the total delay time of the delayed internal clock signal PCLKCD in the first, second and third CAS latency modes of the internal clock delay circuit 601 of FIG. 4. Symbols d1, d2, and d3 denote the delays through the delayers 411, 412 and 413, respectively. In the first CAS latency mode, the total delay time is the sum of d1 and d2. In the second CAS latency mode, the total delay time is d1. In the third CAS latency mode, the total delay time is the sum of d1 and d3. As described above the delay time of the delayed internal clock signal PCLKCD is shorter in the second CAS latency mode than in the first and third CAS latency modes. The delay times of the delayed internal clock signal PCLKCD in the first and third CAS latency modes are independent from each other.

The internal clock signal delay circuits of the present invention, in the second CAS latency mode, reduces the delay time of the delayed internal clock signal PCLKCD and thus the output time tAA of the data output from an output buffer of a synchronous DRAM. In the first CAS latency mode, the delay time of the delayed internal clock signal PCLKCD can be controlled to be long enough to prevent the column selection line enable signals PCSLn of FIG. 1 from being invalid during the test of the memory cell. In particular, when the memory cells are to be tested in a condition that the cycle time of the internal clock signal PCLKC is very short, the invalidation of the column selection line enable signals PCSLn can be prevented by increasing the delay time of the third delayer 413 of FIG. 2 or the second delay circuit 612 of FIG. 4. Here, the internal clock signal delay time is not affected at all in the second CAS latency mode. Also, since the internal clock signal PCLKC passes through different combinations of the delayers in the CAS latency modes, the CAS latency modes can result in different total delay times from one another.

Although the invention has been described with reference to particular embodiments, the description is only an example of the inventor's application and should not be taken as limiting. Various adaptations and combinations of features of the embodiments disclosed are within the scope of the invention as defined by the following claims.

What is claimed is:

1. A semiconductor device comprising:
   a CAS latency signal generator that generates a plurality of CAS latency signals, the CAS latency signals defining CAS latency modes of the semiconductor device, and the CAS latency modes comprising a first CAS latency mode, a second CAS latency mode and a third CAS latency mode; and
   an internal clock delay circuit that receives one of the CAS latency signals and an internal clock signal and delays the internal clock signal by a predetermined time in response to the received CAS latency signal, the internal clock delay circuit comprising a plurality of delay circuits arranged in series that delays the internal clock signal.

2. The semiconductor device of claim 1, wherein the internal clock signal passes through at least two delay circuits among the delay circuits when the semiconductor device operates in the first CAS latency mode.

3. The semiconductor device of claim 1, wherein the internal clock signal passes through at least two delay circuits among the delay circuits when the semiconductor device operates in the third CAS latency mode.

4. A semiconductor device, comprising:
   a CAS latency signal generator that generates CAS latency signals;
   an internal clock delay circuit that receives an internal clock signal and at least one CAS latency signal and generates a delayed internal clock signal; and
   a column decoder that receives the delayed internal clock signal and generates column selection line enable signals in synchronization with the delayed internal clock signal.

5. A semiconductor device, comprising:
   a CAS latency signal generator that generates CAS latency signals comprising a first CAS latency signal, a second CAS latency signal and a third CAS latency signal, wherein the second and third CAS latency signals are disabled when the semiconductor device operates in a first CAS latency mode, the second CAS latency signal is enabled when the semiconductor device operates in a second CAS latency mode, and the third CAS latency signal is enabled when the semiconductor device operates in a third CAS latency mode; and
   an internal clock delay circuit that receives an internal clock signal and the second and third CAS latency signals and generates a delayed internal clock signal, wherein the internal clock delay circuit comprises:
   a first delay circuit that receives the internal clock signal;
   a second delay circuit connected to the first delay circuit;
   a third delay circuit connected to the second delay circuit;
   a first controller that receives an output signal of the first delay circuit and the second CAS latency signal;
   a second controller that receives an output signal of the second delay circuit and the second and third CAS latency signals; and
   a third controller that receives an output signal of the third delay circuit and the second and third CAS latency signals.

6. The semiconductor device of claim 5, wherein the first controller outputs the output signal of the first delay circuit as the delayed internal clock signal when the second CAS latency signal is enabled.

7. The semiconductor device of claim 5, wherein the second controller outputs the output signal of the second delay circuit as the delayed internal clock signal when the second CAS latency signal is disabled, and the third CAS latency signal is enabled.

8. The semiconductor device of claim 5, wherein the third controller outputs the output signal of the third delay circuit as the delayed internal clock signal when the second and third CAS latency signals are disabled.

9. The semiconductor device of claim 5, wherein the internal clock delay circuit further comprises a fourth controller that receives outputs of the first, second and third controllers.

10. The semiconductor device of claim 9, wherein the fourth controller outputs the output of the first controller as the delayed internal clock signal when the semiconductor device operates in the second CAS latency mode, outputs the output of the second controller as the delayed internal clock signal when the semiconductor device operates in the third CAS latency mode, and outputs the output of the third controller as the delayed internal clock signal when the synchronous DRAM semiconductor device operates in the first CAS latency mode.

11. A semiconductor device comprising:
    a CAS latency signal generator that generates CAS latency signals comprising a first CAS latency signal and a second CAS latency signal, wherein the first CAS latency signal is enabled when the semiconductor device operates in a first CAS latency mode, the first and second CAS latency signals are disabled when the semiconductor device operates in a second CAS latency mode, and the second CAS latency signal is enabled when the semiconductor device operates in a third CAS latency mode; and an internal clock delay circuit that only receives an internal clock signal and the first and second CAS latency signals and generates a delayed internal clock signal that depends only on the internal clock signal and the first and second latency signals.

12. A semiconductor device comprising:

a CAS latency signal generator that generates CAS latency signals comprising a first CAS latency signal, a second CAS latency signal and a third CAS latency signal, wherein the first CAS latency signal is enabled when the semiconductor device operates in a first CAS latency mode, the first and third CAS latency signals are disabled when the semiconductor device operates in a second CAS latency mode, and the third CAS latency signal is enabled when the semiconductor device operates in a third CAS latency mode; and an internal clock delay circuit that receives an internal clock signal and the first and third CAS latency signals and generates a delayed internal clock signal, wherein the internal clock delay circuit comprises:

a first delay circuit that receives the internal clock signal;

a second delay circuit connected to the first delay circuit;

a third delay circuit connected to the first delay circuit in parallel with the second delay circuit;

a first controller that receives an output signal of the first delay circuit and the first and third CAS latency signals;

a second controller that receives an output signal of the second delay circuit and the first CAS latency signal; and a third controller that receives an output signal of the third delay circuit and the third CAS latency signal.

13. The semiconductor device of claim 12, wherein the first controller outputs the output of the first delay circuit as the delayed internal clock signal when the first and third CAS latency signals are disabled.

14. The semiconductor device of claim 12, wherein the second controller outputs the output of the second delay circuit as the delayed internal clock signal when the first CAS latency signal is enabled.

15. The semiconductor device of claim 12, wherein the third controller outputs the output of the third delay circuit as the delayed internal clock signal when the third CAS latency signal is enabled.

16. The semiconductor device of claim 12, wherein the internal clock delay circuit further comprises a fourth controller that receives the outputs of the first, second and third controllers.

17. The semiconductor device of claim 16, wherein the fourth controller outputs the output of the first controller as the delayed internal clock signal when the semiconductor device operates in the second CAS latency mode, outputs the output of the second controller as the delayed internal clock signal when the semiconductor device operates in the first CAS latency mode, and outputs the output of the third controller as the delayed internal clock signal when the semiconductor device operates in the third CAS latency mode.

18. A method for delaying an internal clock of a semiconductor device, comprising:

inputting an internal clock signal to an internal clock delay circuit of the semiconductor device, the internal clock delay circuit comprising a plurality of delay circuits; and inputting CAS latency signals to the internal clock delay circuit to determine CAS latency modes of the semiconductor device, wherein the internal clock signal passes through one of the delay circuits in a second CAS latency mode and passes through at least two delay circuits among the delay circuits in either a first CAS latency mode or a third CAS latency mode; and outputting the internal clock signal through the delay circuits as an output signal of the internal clock signal delay circuit.

19. The method of claim 18, wherein the output signal of the internal clock signal delay circuit is input to a column decoder of the semiconductor device.

* * * * *